United States Patent [19]
Hardee

[11] Patent Number: 6,088,270
[45] Date of Patent: Jul. 11, 2000

[54] SENSE AMPLIFIER WITH LOCAL WRITE DRIVERS

[75] Inventor: Kim C. Hardee, Colorado Springs, Colo.

[73] Assignees: United Memories, Inc., Colorado Springs, Colo.; Nippon Steel Semiconductor Corporation, Japan

[21] Appl. No.: 08/284,183

[22] Filed: Aug. 2, 1994

Related U.S. Application Data

[62] Division of application No. 07/976,312, Nov. 12, 1992, abandoned.

[51] Int. Cl.[7] .................................................. G11C 7/00
[52] U.S. Cl. ..................... 365/189.05; 365/207; 365/208
[58] Field of Search ..................................... 365/205, 207, 365/208, 189.05, 189.01

[56] References Cited

U.S. PATENT DOCUMENTS

| | | | |
|---|---|---|---|
| 4,680,735 | 7/1987 | Miyamoto et al. ....................... | 365/210 |
| 4,764,900 | 8/1988 | Bader et al. ............................. | 365/189 |
| 4,948,993 | 8/1990 | Chin et al. ............................... | 307/530 |
| 4,984,206 | 1/1991 | Komatsu et al. ........................ | 365/208 |
| 5,220,527 | 6/1993 | Ohsawa .................................... | 365/149 |
| 5,247,479 | 9/1993 | Young ...................................... | 365/189.05 |
| 5,265,047 | 11/1993 | Leung et al. ............................. | 365/154 |
| 5,267,197 | 11/1993 | McClure .................................. | 365/189.01 |
| 5,298,815 | 3/1994 | Brunolli ................................... | 307/530 |

FOREIGN PATENT DOCUMENTS

| | | |
|---|---|---|
| 329 910 A1 | 8/1989 | European Pat. Off. . |
| 2-18785 | 1/1990 | Japan . |
| 2-27591 | 1/1990 | Japan . |
| 4-228171 | 8/1992 | Japan . |
| 4-252493 | 9/1992 | Japan . |
| 2 260 839 | 4/1993 | United Kingdom . |

OTHER PUBLICATIONS

English abstract re JP 2–18785 to Hitachi Ltd.
English abstract re JP 4–228171 to Hitachi Ltd.
English abstract re JP 4–252493 to NEC Corp.
English abstract re JP 5–303495 to Yamatake Honeywell Co., Ltd.

*Primary Examiner*—A. Zarabian
*Attorney, Agent, or Firm*—Cook, Alex, McFarron, Manzo, Cummings & Mehler, Ltd.

[57] ABSTRACT

A sense amplifier for a very high density integrated circuit memory using CMOS technology is described. Each sense amplifier includes first and second local sense amplifier drive transistors, one connecting the P channel transistors to VCC; the other connecting the N channel transistors to VSS. A read amplifier circuit is provided within each sense amplifier and is operated by read control signals. Internal nodes of the latch of the sense amplifier are coupled by pass transistors that are responsive to column write control signals. Local data write driver transistors are also provided to selectively couple the pass transistors to VCC-Vt or VSS in response to further data write control signals. A relatively wider power line is coupled to the drive transistors to provide VCC thereto, and a narrower line is used to control those first sense amplifier drive transistors. Corresponding wide and narrow lines are used for the second local sense amplifier drive transistors which couple the N channel transistors to ground. Each sense amplifier may be shared between first and second pairs of bit lines through the use of isolation transistors and a corresponding isolation signal.

39 Claims, 7 Drawing Sheets

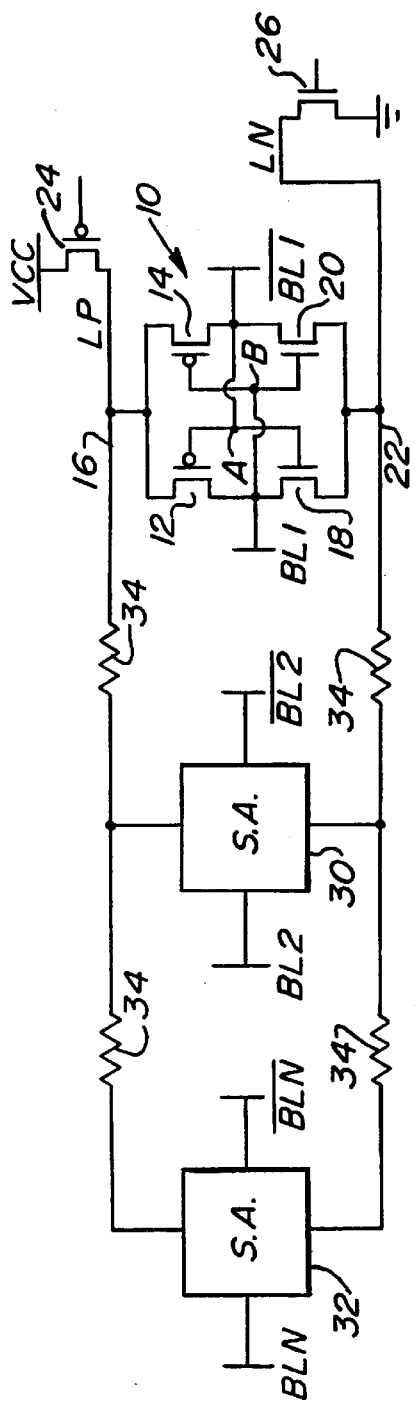
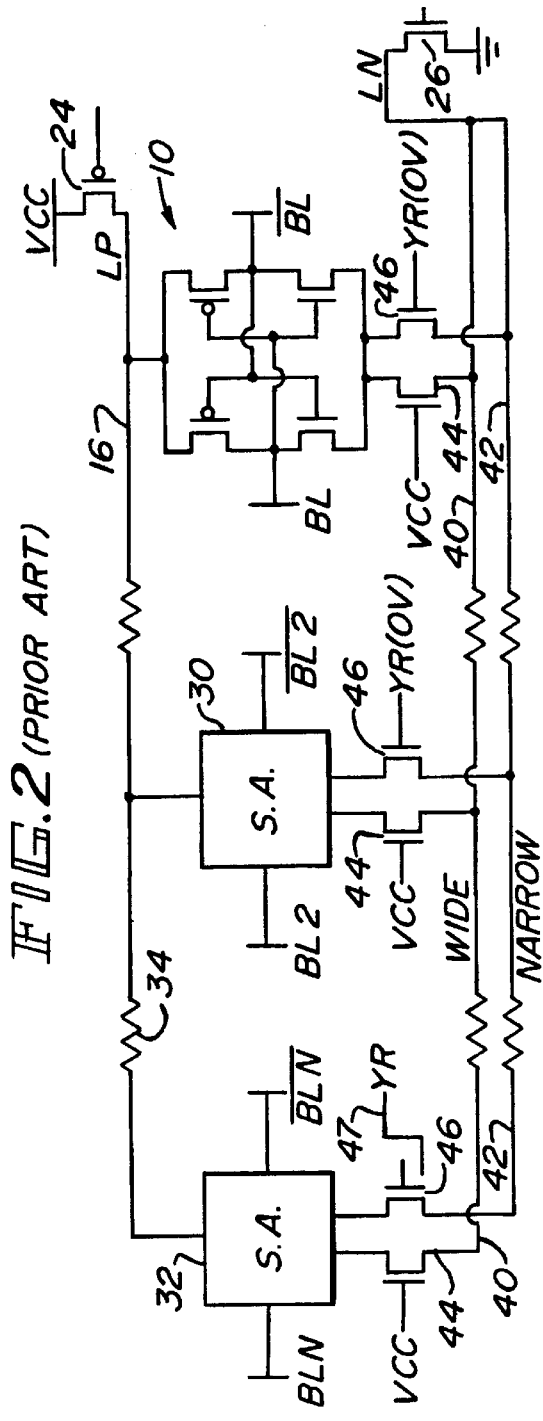

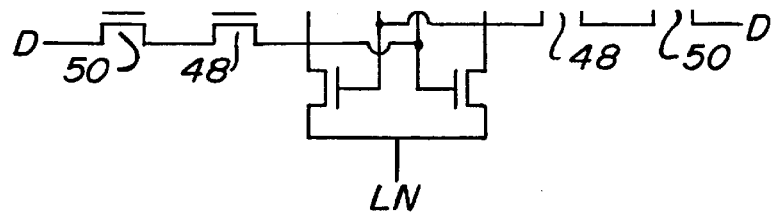
FIG. 3 (PRIOR ART)
FIG. 4 (PRIOR ART)
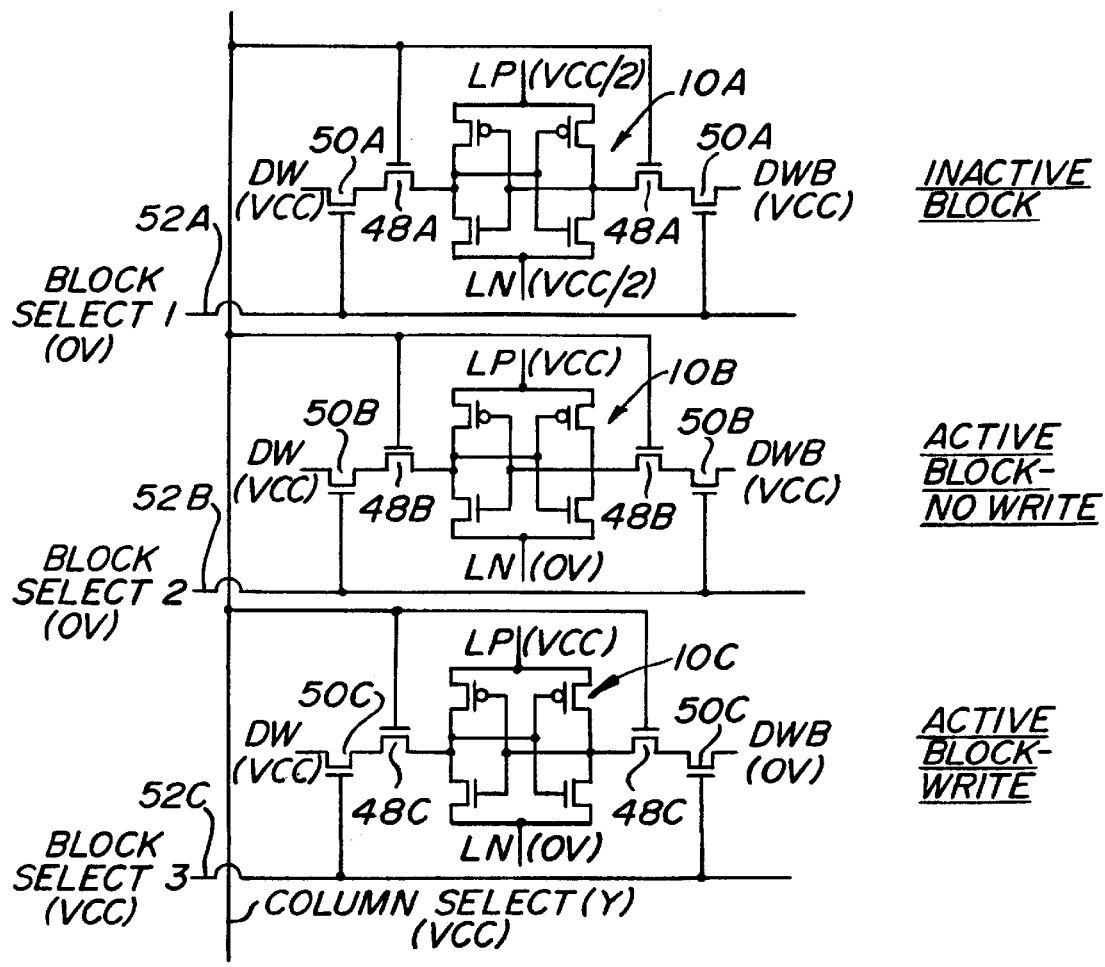

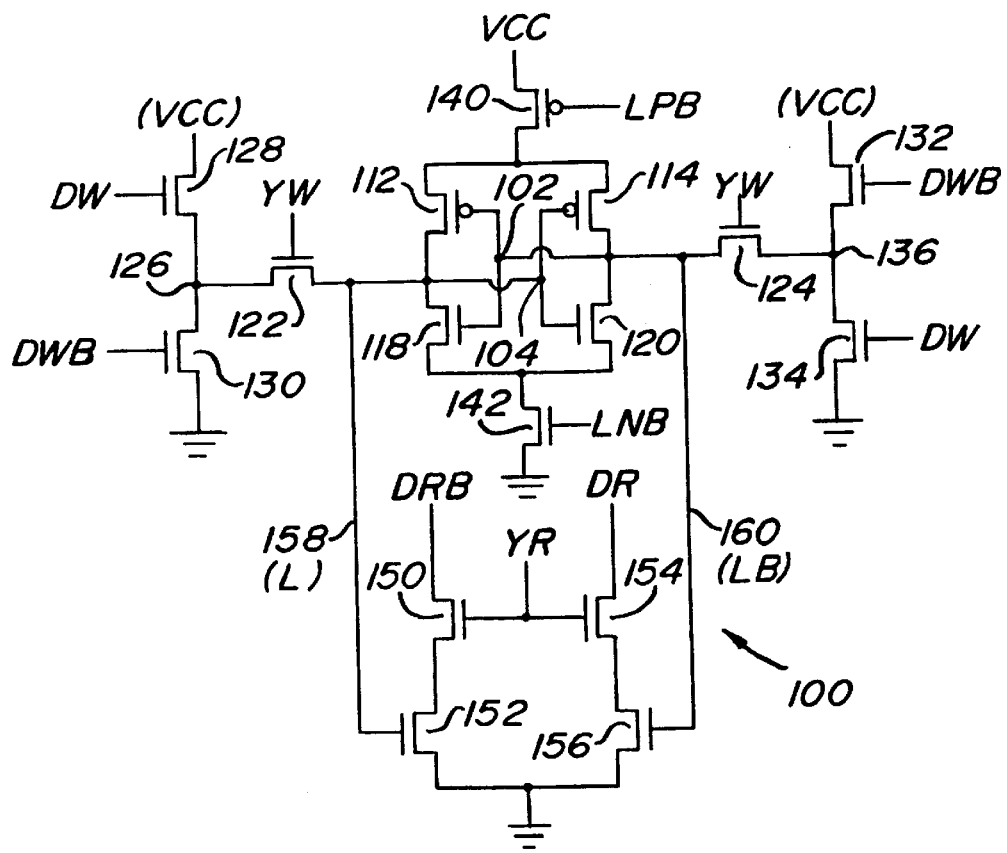
FIG. 5
FIG. 6
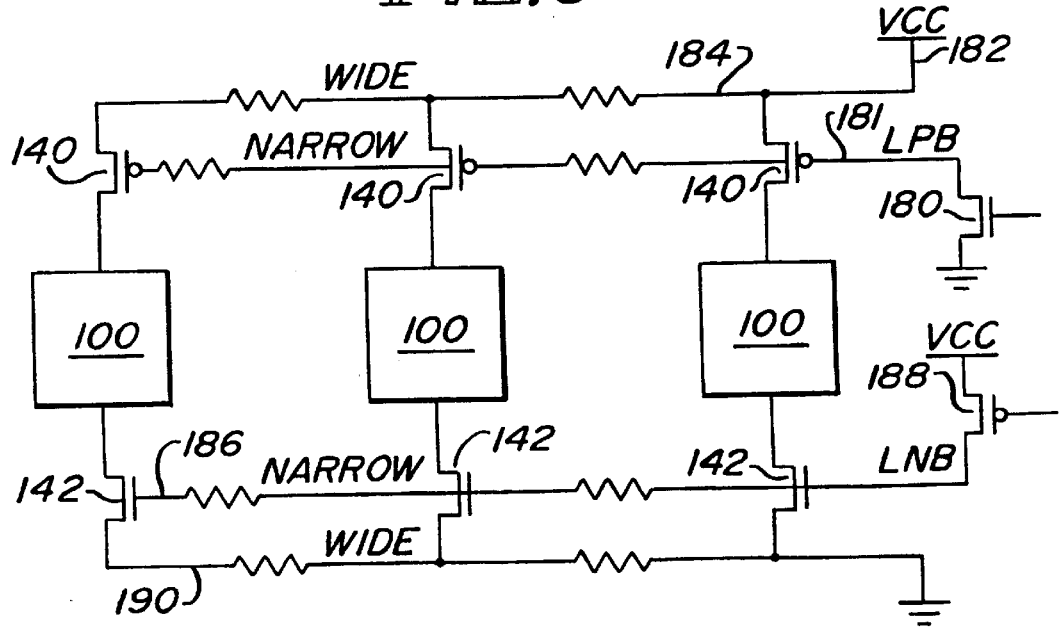

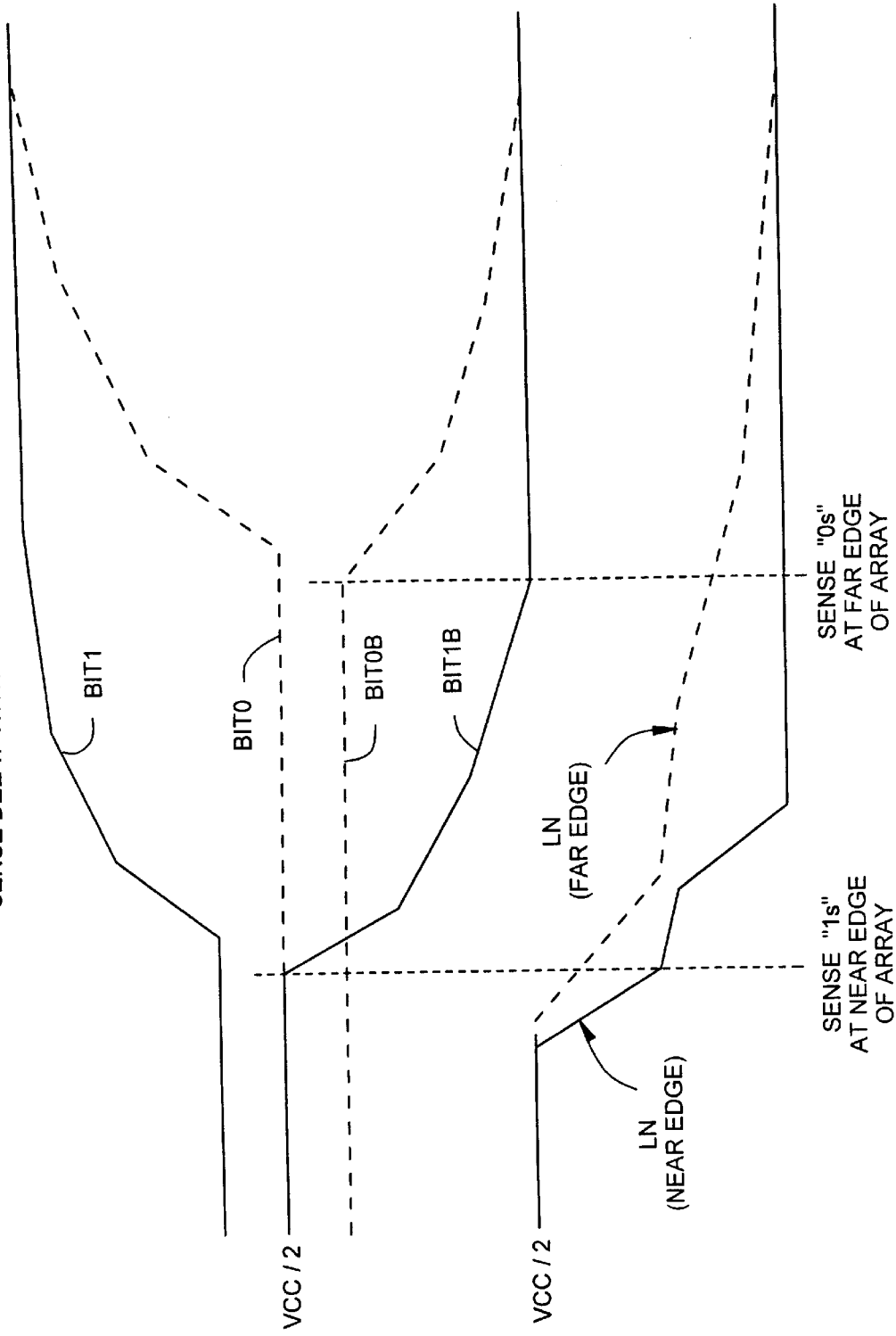

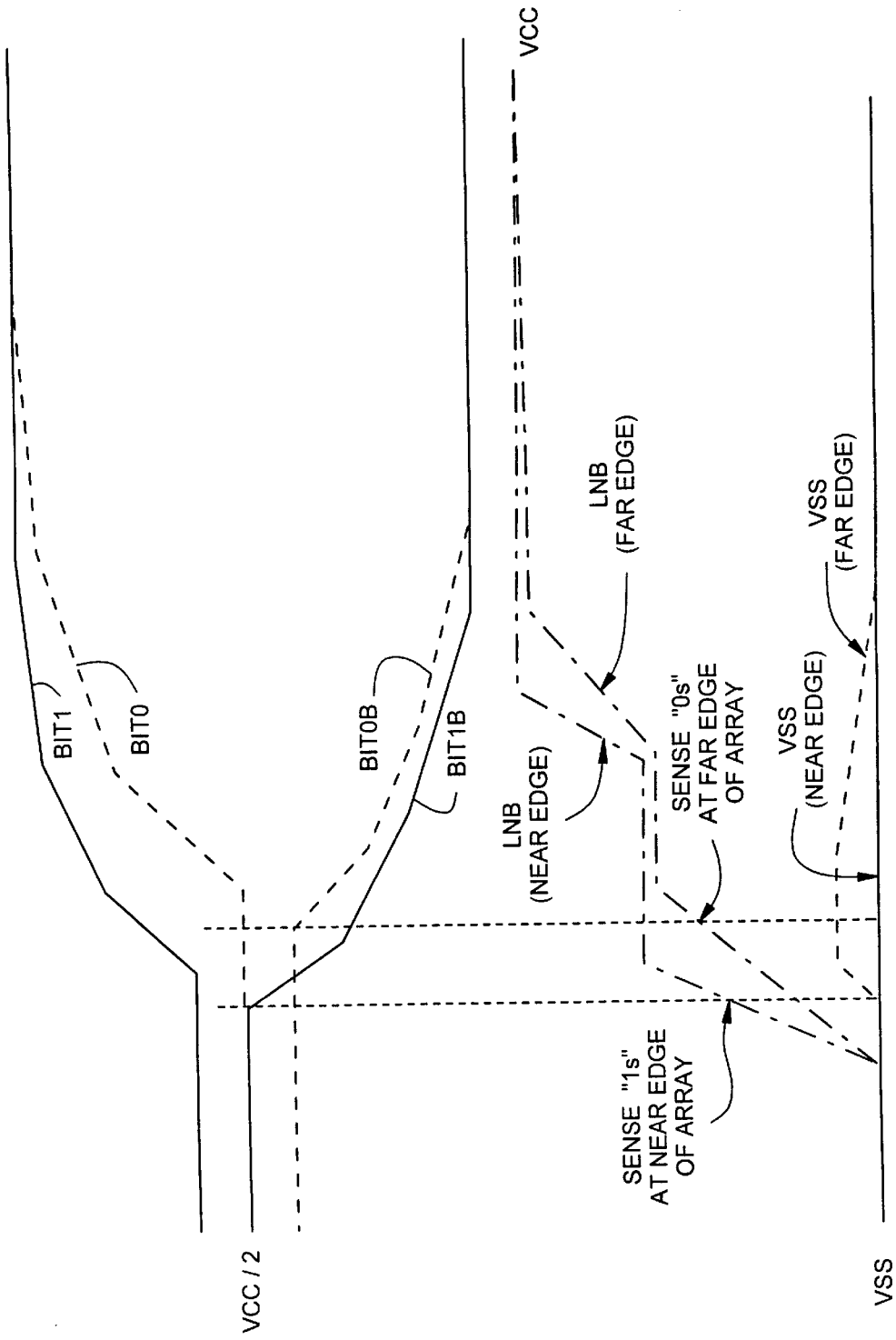

SENSE AMPLIFIER WITH LOCAL WRITE DRIVERS

This application is a divisional of copending U.S. application Ser. No. 07/976,312, filed on Nov. 12, 1992, abandoned.

FIELD OF THE INVENTION

The present invention relates to integrated circuit memories and particularly relates to sense amplifiers for use therein.

BACKGROUND OF THE INVENTION

Integrated circuit memories include a large number of memory cells which are usually set forth in an array. The memory cells may be volatile or non-volatile. If they are volatile, they may be static RAM cells or dynamic RAM cells. There may be one large array, or a given memory chip may have several sub-arrays which may be arranged in blocks. Typically, the memory device comprises a large number of bit lines extending in one direction. The bit lines may be paired or non paired. Where they are paired, they are often referred to as complementary bit lines, or paired bit lines. Complementary bit lines are used for both static RAM and dynamic RAM applications. The bit lines generally extend in a first direction, and a plurality of word lines extend in a second direction which is perpendicular to the first direction. Typically, a memory cell is located at or near the crossing of a bit line with a word line.

Often, a memory array is divided into subarrays, and each subarray may further be divided into blocks. Each subarray will often have its own "peripheral circuitry" such as decoders.

The memory array or subarray is usually said to be organized into rows and columns. Generally, a row indicates the memory cells located along (coupled to) a word line. A column is therefore ordinarily perpendicular to a row and generally indicates a collection of memory cells along (coupled to) a bit line or a bit line pair. Generally, each column is connected to a respective sense amplifier. One job of the sense amplifier is to sense the effect that the memory cell has on the bit line(s) and to amplify that signal for outputting in a read operation. Conversely, the sense amplifier may also drive or control the bit line(s) when the memory is writing data into a memory cell.

CMOS technology is prevalent today. FIG. 1 illustrates a prior art configuration and shows a sense amplifier 10 using CMOS technology. The operation and configuration of such a sense amplifier 10 is well known and will not be explained except briefly herein. Amplifier 10 contains P channel transistors 12 and 14 having source electrodes commonly coupled to a line 16 which carries from time to time a signal LP also called LATCHP. The sense amplifier also comprises a pair of N channel transistors 18, 20 having source electrodes commonly coupled to a line 22 which sometimes carries a signal which may be called LN or LATCHN. A pair of internal nodes A, B are connected to gate electrodes. In particular, node A is coupled to the gate electrodes of transistors 12 and 18, while node B is coupled to the gate electrodes of transistors 14 and 20. These transistors form a latch. A first bit line BL1 on the left side of sense amplifier 10 is coupled to node B which is also coupled between the drain electrode of P channel transistor 12 and the drain electrode of N channel transistor 18. Likewise, a complementary bit line BL1 BAR is connected to node A which is also coupled between the drain electrode of P channel transistor 14 and N channel transistor 20. Transistors 12 and 14 are referred to as "pull-up" transistors whereas transistors 18 and 20 are referred to as "pull-down" transistors. When a transistor 24 is turned on, it couples VCC through its source-drain path to line 16, thereby providing the LATCHP signal. Sense amplifier 10 forms a flip-flop so that either transistor 12 or 14 but not both will be turned on and will pull the voltage at its corresponding node toward VCC. At or near the same time, one of the transistors 18 or 20 will pull down the voltage at the other node toward VSS which will be connected to line 22 via a transistor 26 being turned on. In this way, one of the two nodes is pulled high and the other is pulled low, and the sense amplifier latches into a stable state.

In any large memory, such as a 16 megabit DRAM, there will be thousands of columns and thousands of rows. This is represented in FIG. 1 which shows a second sense amplifier 30 connected to corresponding bit line pair BL2 and BL2 BAR, and an N-th sense amplifier 32 coupled to bit lines BLN and BLN BAR. It should be appreciated that N may be on the order of 1000 or more. The LATCHP signal is applied to all N of these sense amplifiers via line 16, and the LATCHN signal is applied to them via the line 22. It will be seen in FIG. 1 that a plurality of resistances 34 are illustrated. These are not discrete resistance devices but rather indicate the parasitic resistance of the lines 16 and 22, which, even though they are formed of conductive materials such as metal or the like, nevertheless over great distances will have some resistance value. Over each resistance, there will be a voltage drop from the voltage applied via transistor 24 or 26, as the case may be. Accordingly, the voltage that eventually reaches sense amplifier 32 may be appreciably diminished from VCC or VSS, and that sense amplifier will work inefficiently or slowly. It will also be appreciated that because of this problem, sense amplifier 10 does not activate at the same time as sense amplifier 32 and the resulting skew prolongs access time. Additionally, some prior art designs can be unstable if the selected sense amplifier is connected to the data line (the bit lines) too early.

Thus, as power supply (VSS) line 22 is trying to pull down to 0v, transistors start to turn on in the sense amplifiers. A current flows to the right on line 22, and there exists a voltage drop due to the resistance of line 22. Practical limitations prevent the solution of greatly widening line 22 to reduce its resistance—the chip area is jealously allocated. Hence, in the illustrated architecture, the right-most sense amplifier 10 turns on first, and sense amplifier 32 will turn on thereafter.

Generally, one desires to pull down line 22 at a controlled rate. The far end (most remote from transistor 26) of line 22 will drop in voltage slower than the near end. This slows the memory, which is undesirable, but if circuitry drove the near end too fast, then the corresponding near sense amplifiers would become unreliable.

Another problem occurs when the near sense amplifiers latch logic "1's" and the far amplifier latches a logic "0." There is a pattern sensitivity because when the bit lines are precharged to ½VCC, the memory cell moves only one of the bit lines lower or higher. Sensing a "1" occurs before sensing a "0" because LN needs to drop only 1 Vt below a voltage level corresponding to a "1." However, to sense a "0" LN must be 1Vt below ½VCC, and this occurs later. Large current flows when "1's" are read. Because of the large currents, the decline in voltage at the far end of line 22 slows to an uncontrolled rate. This effectively can add 7 nsec. to the sensing process—a substantial and undesirable increase.

One approach that has been proposed for addressing this problem is depicted in FIG. 2. It shows the same sense amplifiers 10, 30, and 32, and has the same signals LATCHP and LATCHN provided by transistors 24 and 26 respectively. However, further N channel transistors have been added beneath the sense amplifiers and a modification has been made so that LATCHN is carried by two distinct lines. One of these lines 40 is constructed relatively wide to carry most of the current, and the other line 42 is relatively narrower because it will carry current for just a single selected sense amplifier. Line 40 is coupled to the sources of a plurality of transistors 44, each sense amplifier having a respective transistor 44. Each transistor 44 has its gate electrode coupled to VCC and is therefore generally on. Transistors 44 are relatively small in size so that they do not carry much current to any single sense amplifier.

The narrower line or rail 42 is coupled to the several sense amplifiers by source-drain paths of respective transistors 46, which are shown also as N channel transistors. Transistors 46 are decoded and this is indicated by a low to high transition signal YR 47 shown beside the gate electrode of transistor 46 for sense amplifier 32 at the far left side of FIG. 2. The other transistors 46 also are coupled to their YR signals, which are shown illustratively at 0v, i.e. they are not selected columns. Thus, the column which has been selected decodes its YR signal to apply to the gate electrode of the transistor 46 thereby to couple the narrow LATCHN line 42 to the sense amplifier. See also Okamura et al., "Decoded-Source Sense Amplifier for High-Density DRAMs", *IEEE J. Solid State Circuits*, Vol. 25, No. 1 (February 1990), pp 18–23. This solution does reduce the sensing skew since the current flowing through line 40 is reduced due to the weak transistors 44 in the current path. Therefore, the voltage drop down line 40 is reduced. Disadvantages of this approach are that the large transistors 46 must be added and that the capacitive loading on the column select signal YR is increased since it must drive the gates of transistors 46. There is poor control over the current draw and extra loading to the YR line because it is driving an extra transistor per sense amplifier.

Chin et al., "An Experimental 16-Mbit DRAM with Reduced Peak-Current Noise," *IEEE J. Solid State Circuits*, vol. 24, no. 5 (October 1989) at p. 1191 et seq. and particularly in FIG. 4 adds both p-channel and n-channel transistors between sense amplifiers and power supply lines. However, FIG. 4(a) does not use one connection to the VCC line and one connection to the VSS line per sense amplifier. It does not drive these power lines from one end only, but rather from several connections that are distributed in the array. Signals SAP and SAN bar may correspond to LP and LN respectively. Thus, in the architecture disclosed in that article, there are several sense amplifiers connected together, and there will still be some pattern sensitivity.

FIG. 4(b), however, in view of the caption for the figure and the accompanying text, could mean that each sense amplifier has a respective pair of local P channel and N channel drive transistors. Nevertheless, FIG. 4(b) shows that all of the P channel transistors (for multiple sense amplifiers) are connected to a single node SAP. All of the N channel transistors are connected to a single node SAN bar.

Chin et al. U.S. Pat. No. 4,948,993 similarly shows such common nodes S and S bar in FIG. 2, but FIG. 3 thereof avoids such common nodes.

FIG. 3 illustrates further transistors that have been used in the past or are used in current generations (16 Meg) of very large capacity integrated circuit memories. Thus, sense amplifier 10 is coupled between LATCHP and LATCHN signals which are generally VCC and VSS. The data signals coming from the data lines are illustrated as D and its complement D BAR. However, the source-drain paths of further pass transistors 48 and 50 couple the data signal D to the sense amplifier, and an identical arrangement is provided for the complementary data signal. Transistor 48 is responsively coupled to a global column select signal Y which is applied to the gate electrode thereof. Most 16 meg DRAMs have such global Y select signals. Additionally, very large scale memories, as mentioned above, include one or more blocks, and transistors 50 are illustrated to show a block enable signal controlling the operation of transistor 50. In this, the complementary data signals must be high, near VCC, during reading and the pass transistors must be small compared to the LATCH transistors to avoid instability.

FIG. 4 shows some of the problems of circuitry styled along the lines of FIG. 3. In FIG. 4, three identically constructed sense amplifiers 10 are illustrated, and for ease of reference they will be referred to in this drawing as 10A, 10B and 10C. For ease of illustration, the LATCHP line 16 and LATCHN line 22 are not shown. The column select signal Y is a global select signal and is therefore shown as having a voltage of VCC. The block enable signals are separately provided so that the pass transistors 50A for sense amplifier 10A have their gate electrodes coupled to a line 52A which carries a first block select signal. Similarly, pass transistors 50B for sense amplifier 10B have their gate electrodes coupled to a second block select line 52B which carries a second block select signal, and a block select signal line 52C similarly corresponds to sense amplifier 10C.

Sense amplifier 10A is illustratively in an inactive block, for sake of explanation. "Inactive" means herein that LN and LP are at ½VCC and the latch is inactive. Its block has not been enabled so the block enable signal on line 52A is low at zero volts. Thus, pass transistors 50A are off, and regardless of whether transistors 48A may be on, sense amplifier 10A is generally isolated from data. However, to prevent it from latching, LATCHP and LATCHN must both be kept at ½VCC, and the data write signal DW and its complement DWB are held at VCC.

Sense amplifier 10B is in an active block with LN at 0v and LP at VCC. However, with the block select at 0v, no write will occur even with the global column select Y at VCC.

Since amplifier 10C is in an active block and a write operation is to occur through amplifier 10C. The block select signal on line 52C is high, at VCC. The column select signal Y is high. With the data signal DW high at VCC and its complement DWB low at zero volts (or vice-versa if different data is being written), the pass transistors 48C, 50C on at least one side of sense amplifier 10C will turn on, and the sense amplifier will latch the data state and drive the bit lines so that the data state will be written into the memory cell or cells along the column (usually at the active word line).

An object of the present invention is to improve the sense amplifiers to overcome or reduce the aforementioned problems.

SUMMARY OF THE INVENTION

The present invention provides a CMOS sense amplifier with local write driver transistors to eliminate the pattern sensitivities and delays of the prior art. Also, each sense amplifier has its own respective drive transistors. Third, each sense amplifier includes a column read amplifier which eliminates the instability problem because the latch nodes are never connected to the data lines. Further, the local write drivers solve the problems associated with global columns selects. Prefer embodiments of the present invention will use column read YR and column write YW signals.

In one of its aspects, while the prior art used narrow and wide lines or rails each carrying a LATCHN signal, the present invention uses narrow and wide lines in connection with the LATCHN signal but connects them differently. Additionally, the present invention in one of its aspects includes narrow and wide lines or rails for the LATCHP supply signal. Thus, in the preferred embodiment, each sense amplifier has a respective N channel transistor having its source-drain path coupled to VSS or a signal LATCHN via the wide line. The gate electrodes of those N channel drive transistors are gated by the narrow drive line which preferably carries the complement LNB of the LATCHN signal.

Correspondingly, in another aspect of the invention, each sense amplifier includes a respective P channel drive transistor, the source-drain path of which couples the P channel transistors of the sense amplifier latch to the high voltage such as VCC or LATCHP. That high voltage is carried by one of the wide drive lines. The narrower of the drive lines associated with LATCHP is coupled to the gate electrodes of these P channel drive transistors and carries a complement LPB of the LATCHP signal.

Preferably the sense amplifier is shared by a column on each side thereof.

Three aspects of present invention therefore are:
(1) the connection of each sense amplifier via transistors or other switching devices to the power supply lines without directly connecting together power supply lines for multiple sense amplifiers;
(2) the use of local read amplifiers; and
(3) the use of local write circuitry.

Further aspects of the invention exist, and these three are mentioned as salient points. While it may not be necessary to employ all three in combination to embody the present invention, the use of all three features is most beneficial.

BRIEF DESCRIPTION OF THE DRAWINGS

In describing the prior art and the present invention, reference has been made and will be made to accompanying drawings wherein:

FIG. 1 shows a typical CMOS sense amplifier group;

FIG. 2 shows the same group of sense amplifiers connected according to one prior art modification;

FIG. 3 shows the same prior art sense amplifier with pass transistors for a global column select and for block enable features;

FIG. 4 shows three such prior art sense amplifiers having column select and block enable capabilities and illustrating the voltages applied from time to time depending on the current state of the sense amplifier;

FIG. 5 illustrates a sense amplifier constructed according to a preferred embodiment of the present invention;

FIG. 6 shows a simplified form of the sense amplifier of the present invention collected into a group of such sense amplifiers according to a further aspect of the invention;

FIG. 9 illustrates the sense delay with traditional sense amps; and

FIG. 10 illustrates the sense delay with modified sense amps.

DESCRIPTION OF THE PREFERRED EMBODIMENT

Figure 7:
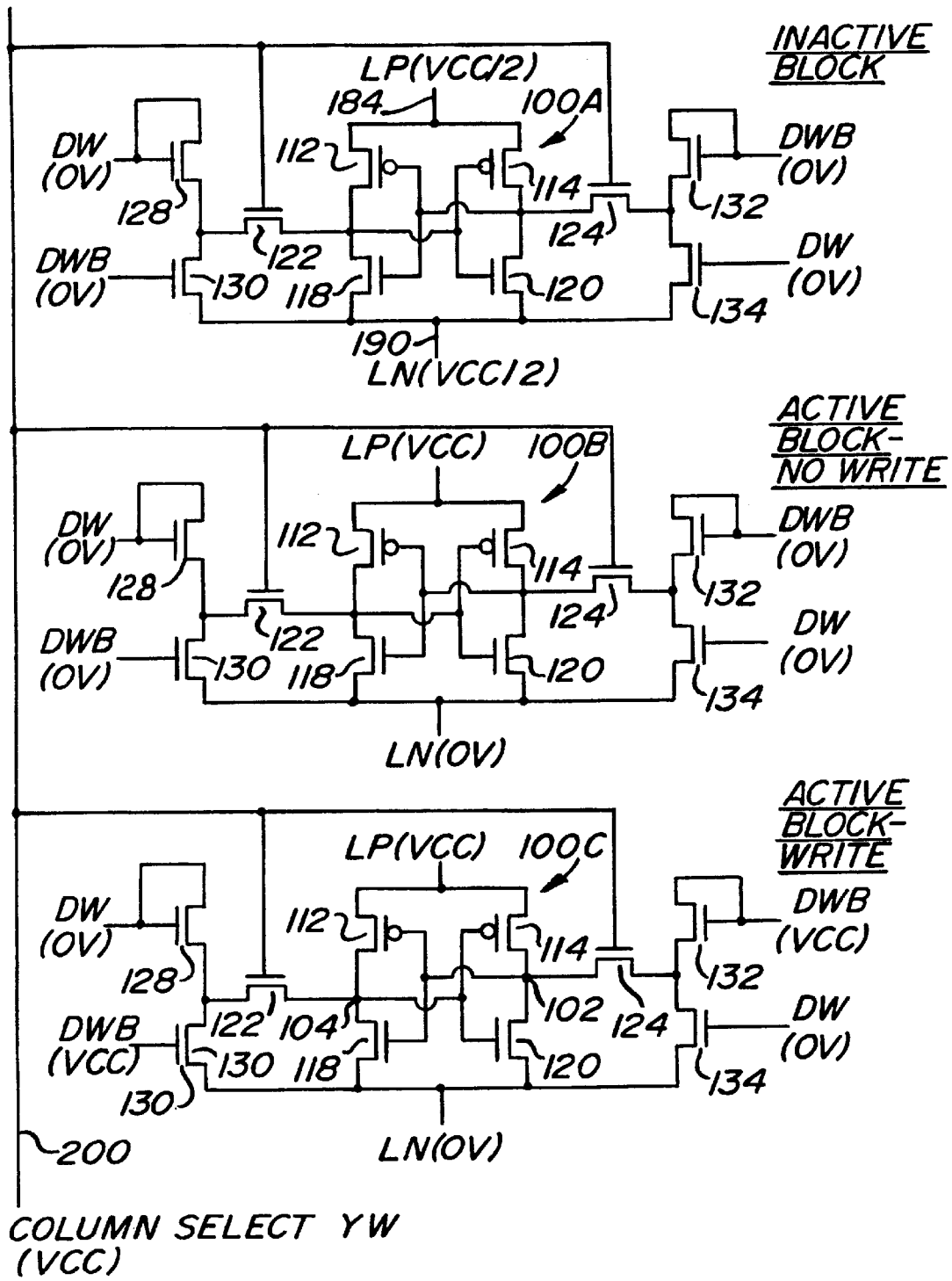
FIG. 7 shows how the sense amplifier of the present invention may operate in various modes.

FIG. 5 illustrates a preferred sense amplifier 100 according to various aspects of the present invention. Amplifier 100 includes internal nodes 102 and 104 in a latch formed by transistors 112, 114, 118 and 120. Node 102 is coupled to the gate electrodes of P channel transistor 112 and N channel transistor 118, whereas node 104 is coupled to the gate electrodes of P channel transistor 114 and N channel transistor 120. The configuration of the flip-flop itself within the sense amplifier is the same as that of sense amplifier 10.

A column write select signal $Y_W$ is coupled to the gate electrodes of pass transistors 122, 124. Preferably, the column write signal YW and a column read signal YR described below are decoded for each four columns, so that each four columns has a unique YW and YR. However, this is unnecessary to embody the principles of the invention. In one configuration, each subarray may be fairly large—4 Meg illustratively—and may have a respective column decoder that will generate column select signals for that whole subarray. It is desired to be able to write to just one block within the subarray. That will be an "active block" wherein the sense amplifiers are active. An "inactive block" is one where the sense amplifiers are in precharge.

Returning to the description of FIG. 5, however, the source-drain path of pass transistor 122 is coupled to node 104, and the source-drain path of transistor 124 is coupled to node 102.

Transistor 122 is also coupled to a node 126 between the source electrode of a local data write driver transistor 128 and the drain of another local data write driver transistor 130. Transistors 128 and 130 are N channel devices having their source-drain paths coupled in series. The drain of transistor 128 is coupled to VCC and the source of transistor 130 is coupled to ground. A data write signal DW is coupled to the gate electrode of transistor 128 and its complement DWB is coupled to the gate electrode of transistor 130. A similar configuration exists on the right side of sense amplifier 100 where transistors 132 and 134 are coupled between VCC and ground and have a node 136 therebetween which is coupled to transistor 124. Note, however, that the data write signal DW is coupled to control transistor 134 whereas its complement DWB is coupled to the gate electrode of transistor 132. That is to say, the data write signal DW turns on a pull-up transistor 128 on the left side of the sense amplifier 100, but turns on a pull down transistor 134 on the right side of sense amplifier 100. Its complementary signal DWB likewise has reciprocal effects on the left and right sides.

The source electrodes of P channel transistors 112 and 114 within amplifier 100 are coupled to a further P channel transistor 140, the source electrode of which is coupled to VCC (or LATCHP). The gate electrode of this P channel device 140 is coupled to receive a signal LPB which is the logical complement of LATCHP. FET 140 is referred to as a local sense amplifier drive transistor. Similarly, the source electrodes of the N channel transistors 118 and 120 within amplifier 100 are coupled to ground through the source-drain path of a further local sense amplifier drive transistor 142. The gate electrode of transistor 142 is coupled to receive signal LNB which is the logical complement of LATCHN.

The lower portion of FIG. 5 includes a local column read amplifier which includes four N channel transistors 150, 152, 154, and 156. The source-drain paths of transistors 150 and 152 are coupled in series. The drain electrode of transistor 150 receives a signal DRB which is a logical complement of a data read signal DR. The source electrode of transistor 152 is coupled to ground. Node 104 is coupled via a conductive line 158 to the gate electrode of transistor 152. The gate electrode of transistor 150 is coupled to a column read signal $Y_R$. The source-drain path of transistors 154 and 156 are coupled in series between the data read signal DR and ground. The gate electrode of transistor 154 is coupled to the gate electrode of transistor 150, and accordingly As coupled to the column read signal $Y_R$. The gate electrode of transistor 156 is coupled to internal node 102 via a conductive line 160.

Hence, the circuit of FIG. 5 includes data read circuitry formed by transistors 150 through 156. Transistors 128, 130, 132 and 134 comprise local data write transistors. Transistors 140 and 142 comprise local sense amplifier drive transistors. It will be understood that there are thousands of such circuits 100 in a large integrated circuit memory. The signals LPB and LNB connected to the local sense amplifier drive transistors, the data write signal DW and its complement DWB coupled to the local data write driver transistors, and the data read signals DR and DRB are shared among or applied to many sense amplifiers on the memory device. The global Y select signals $Y_R$ (for reading) and $Y_W$ (for writing) are shared among several sense amplifiers in a direction perpendicular to the LNB, LPB, and data lines. There are separate read and write data buses. DR and DRB comprise a read data bus and DW and DWB comprise a write data bus. To sense (latch) data, the bit line signal is connected to the latch nodes L and LB by circuitry shown in subsequent drawings, or can be connected directly in some embodiments to these latch nodes, and then the local sense amplifier drive transistors 140 and 142 turn on by LPB going low and LNB going high. These transistors 140 and 142 give the advantage over the traditional sense amplifier that each sense amplifier is decoupled from other sense amplifiers, and latching can be more accurately controlled with these two signals LPB and LNB. The sense amplifiers are decoupled from each other because the drains of transistors 140 and 142 are separate for each sense amplifier.

Transistors 150, 152, 154, 156 comprise a read amplifier which provides a non-destructive read operation. The column read signal YR can go high at any time, even prior to latching, without upsetting the sense amplifier. Additionally, the data read signals DR and DRB can be at any voltage without upsetting the sense amplifier. A further advantage is that transistors 150 through 156 can be sized independently of the sense amplifiers transistors 112, 114, 118, 120.

Writing is accomplished when the column write signal $Y_W$ (a decoded signal) is high and either of the data write signals DW or DWB is high. If both of these data write signals are low, writing does not occur. This circuit eliminates the need for a block enable (BE) signal of the sort shown in FIG. 3 and implicit in FIG. 4. The local data write driver transistors 128–134 can be shared with other column circuits as long as they have separate column write signals. A modification to this circuit of FIG. 5 couples the gate electrode of transistor 128 to its drain, and does the same for transistor 132. This may reduce the number of metal lines required and can save area or improve the layout. They will result in about the same writing speed. The VCC connections at the drain electrodes of transistor 128 and 132 are eliminated, but there is some increased loading on the data write signals DW and DWB.

FIG. 6 is similar to FIG. 1 and FIG. 2. For clarity of illustration, sense amplifiers (and associated circuitry) 100 are shown in block form in FIG. 6. Each block marked 100 is intended to include all of the devices of FIG. 5 with the exception of transistors 140 and 142 which are shown in FIG. 6 for each sense amplifier 100. The connections to the bit lines are not shown, and it will be understood that each sense amplifier 100 may be connected to a respective pair of bit lines either directly or selectively through nodes 102 and 104 of FIG. 5. In FIG. 6, power is supplied to the P channel transistors 112, 114 of each sense amplifier 100 via transistors 140. Preferably each transistor 140 is a P channel device the gate electrode of which is coupled to the signal LPB which stands for Latch P BAR. A relatively narrow line connects the LPB signal to the gate electrodes of an entire group of sense amplifiers 100 as shown in FIG. 6. The LPB signal may be generated by a transistor 180, the source-drain path of which is coupled to ground. Transistor 180 may comprise an N channel transistor so that when a positive voltage is applied to its gate electrode, LPB is pulled to ground and all of transistors 140 coupled to that particular transistor 180 should turn on. This would thereby couple the VCC voltage (or LATCHP signal) applied at 182 through a relatively wide line 184 to the source electrodes of transistors 140.

A similar configuration is used for the N channel transistors at the bottom of FIG. 6. The N channel transistors 118, 120 within sense amplifiers 100 are coupled to ground via N channel transistors 142 as explained with respect to FIG. 5. The gate electrodes of transistors 142 are coupled via a relatively narrow line 186 to the signal LNB which stands for Latch N BAR. Signal LNB may be generated by a preferably P channel transistor 188, the source-drain path of which is coupled between VCC and line 186. The gate electrode of transistor 188 and transistor 180 are coupled to suitable control signals. When transistor 188 is conductive (its gate electrode receives a low voltage), the LNB signal is pulled to VCC thereby to turn on transistors 142. This couples each sense amplifier to a relatively wide line 190 which couples VSS (or LATCHN) to the source electrodes of each transistor 142.

In FIG. 6, the narrow line 181 carries very little current. Each sense amplifier 100 is isolated from the others. Each one has its own connection to the power supply lines 184 and 190. This reduces or eliminates pattern sensitivity of the type which is encountered in architectures such as Chin with distributed connections (multiple sense amps connected together to power supply lines).

FIG. 7 shows some of the voltages when the preferred circuit 100 is used in a large memory, and is comparable to FIG. 4. Not all of the devices of FIG. 5, however, are shown in FIG. 7, and only some of the devices have been labeled in sense amplifier 100A. Thus, the local data write driver transistors 128, 130, 132 and 134 are labeled, as are the column write select transistors 122, 124. Not shown are the local sense amplifiers drive transistors 140 and 142, but the connections are shown to LATCHP and LATCHN which may be taken to be either the wide lines 184 and 190 or the drain electrodes of transistors 140 and 142. The column read amplifier formed by transistors 150–156 is not shown and should be understood to be present. Assuming that a column write signal is to be generated, the column select signal on line 200 is shown as being high, at VCC. FIG. 7 assumes that sense amplifier 100A is to be part of an inactive block, sense amplifier 100B is for an active block without a write, and sense amplifier 100C is part of an active block where a write is to occur.

Sense amplifier 100A in the inactive block receives a full VCC signal at the gate electrode of its pass transistors 122 and 124. However, the local data write driver transistors 128 through 134 all receive zero volts applied to the gate electrodes thereof because DW and DWB are at zero volts. It will be noted that with regard to the transistors 128 and 132, the aforementioned modification has been shown where the connection to VCC has been eliminated at the drain electrodes of those transistors which have instead been connected to their gate electrodes. Note that in the inactive block, the P channel transistors 112, 114 are coupled to receive only ½VCC, and likewise the N channel transistors 118 and 120 are coupled to receive the same voltage. Thus, in this state, the latch is inactive and no power is consumed.

Sense amplifier 100B is located in an active block but is not to have a write operation. Because it is in an active block, the LATCHP signal is at a full VCC, and the LATCHN signal is at zero volts. However, since no write operation is to occur, DW and DWB are low (0v), and transistors 128 through 134 comprising the local data write driver transistors are all coupled to receive zero volts at their gate electrodes. In this configuration, the sense amplifier latch holds the previous data state and no write occurs.

Sense amplifier 100C is in the active block and therefore LATCHP is at a full VCC level and LATCHN is at zero volts, as shown. However, a write operation is to occur, and illustratively the data write signal DW is at zero volts and its complement DWB is at VCC. Transistor 130 turns on, thereby coupling the zero volts from LATCHN to the node 104 via pass transistor 122. Transistor 132 receives VCC at its gate electrode and its drain electrode, and will turn on, coupling a non-zero voltage through pass transistor 124 to node 102. With node 102 at a non-zero voltage and node 104 pulled down to zero volts via transistor 130, the sense amplifier latches and will drive the bit lines (not shown) to the one of the data states. (The other data state may be written to by driving the data write signal DW to VCC and its complement DWB to zero volts.)

Figure 8:
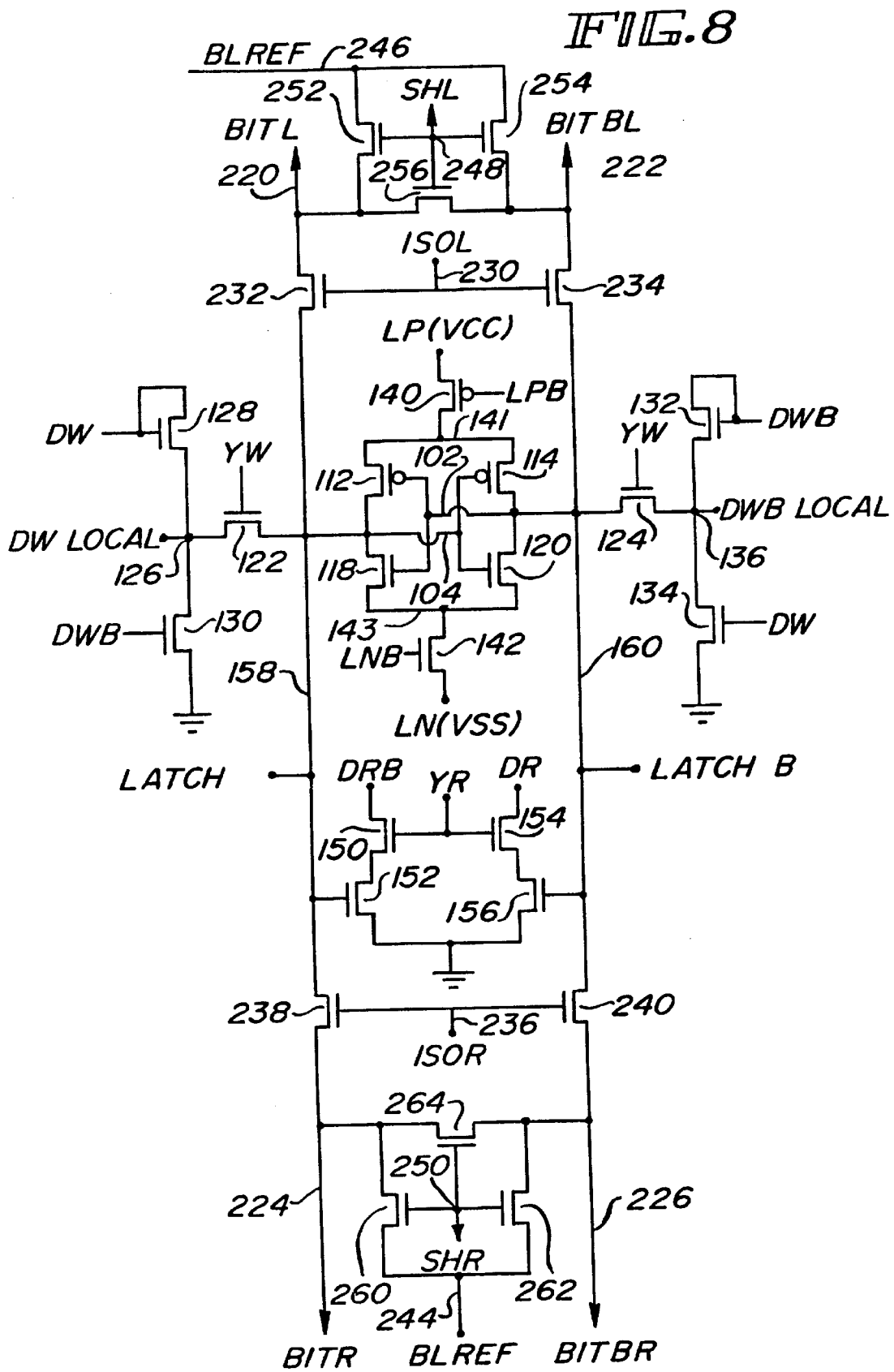
FIG. 8 shows how the preferred sense amplifier may be connected selectively to two pairs of bit lines.

FIG. 8 shows an embodiment of sense amplifier 100 connected between opposing bit lines so that it can serve either of two bit line pairs. FIG. 8 shows the latch node L (LATCH) from FIG. 5 which is electrically at line 158 and its complementary node LATCHB which is coupled to line 160. (These are labels.) Indeed, generally all of FIG. 5 is shown in the middle of FIG. 8, and FIG. 8 shows how the preferred embodiment circuit is coupled to be shared by a first bit line pair 220, 222 are marked BITL and BITBL (standing for the left bit line and the left bit bar line). Additionally, a second bit line pair 224, 226 is shown at the bottom of FIG. 8 and is marked BITR and BITBR (standing for the right bit line and the right bit bar line). Isolation signals applied to gate electrodes of switching transistors determine which of these two bit line pairs the sense amplifier will co-act with at any given time. Thus, an ISOLATION LEFT signal (ISOL) is coupled to a node 230 which is applied to gate electrodes of illustratively N channel field effect transistors 232, 234 so that when the signal on line 230 rises to a high voltage, transistors 232 and 234 turn on thereby coupling the bit line pair 220, 222 to the nodes of sense amplifier 100. Likewise, an ISOLATION RIGHT signal (ISOR) is applied to a node 236 which is coupled to gate electrodes of further N channel transistors 238, 240 and when that signal is high, transistors 238 and 240 couple the sense amplifier 100 to the bit line pair 224, 226. These selective couplings occur via the source-drain paths of these isolation transistors which couple line 158 to line 220 or to line 224 selectively, and which couple line 160 with line 222 or 226 selectively, depending on the state of the ISOLATION LEFT and ISOLATION RIGHT signals. It will be appreciated that P channel transistors could be used instead of N channel transistors. It is further possible to have transistors 232 and 234 be P channel transistors with transistors 238 and 240 being N channel transistors, and both receive the same isolation signal. Obviously, either pair is P channel and the other pair could be N channel, in a modification of FIG. 8. In such event, with one pair being P channel and the other being N channel, a single signal applied two places would turn one pair of transistors on and the other pair off, thereby selectively coupling the sense amplifier 100 to only one bit line pair, either left or right depending on the signal and the configuration of the transistors. The exact nature of the signal and the transistors can be varied as desired for any application.

Further circuitry shown in FIG. 8 includes a reference input BLREF applied to nodes 244 (bottom) and 246 (top of FIG. 8). Signals SHL at a node 248 and SHR at a node 250 are used in precharging the bit lines. At the top of FIG. 8, it will be seen that the signal SHL is applied to the gate electrodes of transistors 252, 254, and 256. Transistor 256 is generally an equilibrating transistor which shorts the two bit lines 220, 222 together whenever that transistor is turned on. Transistors 252 and 254 have their source-drain paths connected between the bit line reference BLREF at node 246 and the bit lines 220, 222 respectively and will therefore, when turned on, couple the bit line reference voltage to the bit lines themselves. Likewise, the configuration at the bottom of FIG. 8 includes transistors 260, 262, and 264 which operate similarly in response to the SHR signal. Again, these transistors 252 through 264 are N channel transistors but other types of switching devices might be employed in any given embodiment. The bit line reference is illustratively a constant voltage approximately equal to ½VCC in one preferred embodiment. Thus it will be seen that this sense amplifier circuitry 100 is shared by two memory cell arrays or columns of respective arrays represented by the left and right pairs of bit lines.

The sensing, reading, and writing operation may be reviewed with reference to FIG. 8. First of all, during precharge LNB is at ground potential and LPB is at VCC. For sensing an active column or array of columns, LNB will go to a level of about VCC above ground, and turn on transistors 142. This tends to pull node 143 towards ground. At approximately the same time, or slightly later, LPB goes low, turning on transistor 140 and pulling node 141 high, thereby enabling the latch. This will pull one of the bit lines toward VCC potential and the other one towards ground for reading.

YR goes high for the selected column or columns, turning on transistors 150 and 154 which are connected to the data read lines DR and DRB. (Preferably, DR and DRB go to a secondary amplifier circuit, not shown herein.) One of the latch nodes has been driven high and the other latch node. The latch nodes are coupled to the gates of transistors 152 and 156.

An isolation/selection signal ISOL at node 230 will be at VCC potential during initial sensing so that the voltages on bit lines BL and BL BAR are transferred into the Latch and Latch Bar nodes just before sensing. Actually the sense amp or the latch is amplifying the latch nodes, not the bit lines directly.

The transistors 150–156 comprise the local read amplifier. YR goes high, and for example, the latch node is high or going high at that time. Latch bar is low or going low. A differential of current goes through transistors 152 and 156 because they have gate voltages at different levels. The differential current is transferred onto the data read lines DR, DRB. This differential current is further amplified with a secondary amplifier not shown on this drawing. That is how reading is accomplished. An advantage to this local read amplifier is this is a non-destructive read. The DR and DRB lines are effectively decoupled from the Latch and Latch B lines so there is no way to upset the signal on the Latch and Latch B lines during reading. Hence the timing of the YR signal is very noncritical, unlike previous DRAMs.

The isolation/selection signals ISOL and ISOR are both at VCC potential during precharge and just before sensing, either ISOL or ISOR will go to ground potential to isolate either the left or write array, whichever is not to be read from or from which data is not to be sensed. The other isolation/ select signal (which corresponds to the array from which data is to be sensed) stays at VCC potential during initial sensing. Shortly after sensing begins, it goes to a level above VCC so that the circuit can latch and write back to the bit or bit bar line a full VCC potential without a threshold voltage drop due to either transistor 232 or 234. Then in the next precharge cycle, that ISO signal comes from the value above VCC back down to VCC, and the other ISO signal on the other side goes from ground potential back up to VCC for precharge.

For writing, local write transistors 128, 130, 132 and 134 are used. During writing, YW goes high. Since this is a "global" signal (meaning that in a preferred embodiment YW is connected to several sense amps in a subarray), and since one may want to write data to only one or two of the many sense amps, more control than just the YW is provided (re decoding). If YW is high and one does not want to write, then DW and DWB are both held at ground potential. No current flows through transistors 122 and 124 which have their gate electrodes driven by YW. So DW Local and DWB Local are simply floating at whatever value Latch and Latch Bar calls for: there is no upset of the latch signal.

To write to this particular sense amp, DW would go to VCC potential and DWB would stay at ground potential (or vice versa). With DW at VCC potential, transistor 128 on the left side turns on, pulling node DW Local towards VCC minus one Vt. On the other side, with DW going high, transistor 134 turns on, pulling node DWB Local toward ground. This differential voltage that is forced on the DW Local nodes will—since YW is high—actually flip the latch and drive the bit lines, one to VCC and one to ground.

It will be understood generally that in this specification, the nomenclature of a "B" or "BAR" represents the logical complement of a given signal and typically takes a different voltage than the assertion of the signal. That is to say, if the asserted state is at VCC which is illustratively 5 volts, the complement thereof will be at zero volts, or vice-versa. It will be further understood that the symbol "L" may be understood as a latch signal and when combined with a P symbol stands for latching by turning on P channel transistors, and the LN symbol represents turning on the N channel transistors of a latch. This is true, however, when the LP and LN signals are asserted. When they are not asserted, the P channel and N channel transistors are not turned on.

The present invention therefore has been described as including, in various of its aspects, a pair of local sense amplifier drive transistors 140, 142. Preferably each of these cooperates with a respective pair of current carrying lines, one of them being a relatively wider line to carry the greater amount of current, the other being a relatively narrower line because it is coupled to the gate electrode or control electrode of its respective transistor 140 or 142. These have been illustrated in FIG. 6. Another aspect of the invention which has been described is the inclusion of local data write drivers transistors 128 through 134 with its data write control signal DW and its complement DWB. While these have been illustrated as N channel devices in FIGS. 5 and 8, they could be modified to be P channel transistors, or other switching devices. These transistors provide isolation and thereby lower the stand-by current or normal current drain of a sense amplifier where no writing operation is to occur, as has been shown and explained with reference to FIG. 7. Such circuitry cooperates with the global column write signal $Y_W$ and its transistors 122, 124. Additionally, another aspect of the invention has been shown and described comprises the local column read amplifier which as embodied in FIGS. 5 and 8 comprises transistors 150 through 156. Cooperating with such transistors are the data read control signal DR and its complement DRB, and the column read signal YR. It will be appreciated that while these have been illustrated as N channel transistors, other transistors or switching devices may be substituted, including but not limited to P channel transistors. This read amplifier provides a non-destructive read operation and the column read signal may be brought high at any time, even prior to latching, without upsetting the sense amplifier. These read amplifier transistors may be sized independently of the sense amplifier transistors.

An advantage of the local sense amplifier drive transistors is that each sense amplifier may be decoupled from the other sense amplifiers and latching can be more accurately controlled with the signals LNB and LPB. Thus, the pattern sensitivity of the architecture of Chin et al. is overcome by providing a respective pair of transistors for each sense amplifier, one transistor for each of the two power supply lines.

To help illustrate the advantage of the local sense amp driver transistors, FIG. 9 showing the sense delay with traditional sense amps and FIG. 10 showing the sense delay with modified sense amps have been included herein.

It will be appreciated that the specific preferred embodiment eliminates the need for the block enable signal, although in other configurations a block enable signal may still be included with a appropriate circuitry.

Not described herein is the signal applied to transistors 180 and 188. The signals, circuitry used to generate them, and the method employed are set forth in my companion application U.S. Ser. No. 07/969,418 bearing the title "SENSE AMPLIFIER CLOCK DRIVER" issued on Aug. 2, 1998 as U.S. Pat. No. 5,334,890, the disclosure of which is incorporated by this reference.

It will be understood that the present invention is not intended to be limited to the specific drawings and description that has been presented herein, and that various modifications, alterations, and substitutions may be made without departing from the scope and spirit of the present invention. Accordingly, the present invention is to be determined by the claims in light of the specification as drawings.

I claim:

1. A sense amplifier arrangement for an integrated circuit memory comprising:

a latch circuit having internal nodes for coupling to a respective bit line pair;

a pair of pass transistors each coupled to a respective one of said internal nodes, the pass transistors having a control electrode coupled to receive a first control signal;

a pair of local data write driver circuits having respective control electrodes coupled to receive second write control signals for data write operations and to provide a pair of data write output signals, each local data write driver circuit being coupled to its corresponding pass transistor so that the pass transistor, when conductive, couples one of said output signals from the local data write driver circuit to the corresponding internal node of the latch circuit and to a corresponding bit line.

2. The sense amplifier arrangement according to claim 1 wherein each of said local data write driver circuits comprises a pull-up transistor and a pull-down transistor having their source-drain paths coupled in series and forming an output node therebetween, said output node being coupled to the corresponding pass transistor, said source-drain paths being coupled between first and second voltages.

3. The sense amplifier arrangement according to claim 2 wherein said first control signal is a write control signal, and wherein said pass transistor is connected to receive said write control signal at its control electrode.

4. The sense amplifier arrangement according to claim 3 wherein said write control signal is a column write signal.

5. The sense amplifier arrangement according to claim 4 wherein said column write signal is a decoded column write signal.

6. The sense amplifier arrangement according to claim 5 wherein said integrated circuit memory has a plurality of columns and wherein said decoded column write control signal is decoded for a subset of said plurality of columns.

7. The sense amplifier arrangement according to claim 6 wherein said decoded column write signal is decoded for four columns of said memory.

8. The sense amplifier arrangement according to claim 2 wherein said local data write driver circuits receive said second write control signals at control terminals of said pull-up and pull-down transistors.

9. The sense amplifier arrangement according to claim 8 wherein said second write control signals comprise first and second data write signals; and wherein one said pull-up transistor in the local data write driver circuits for the corresponding latch circuit receives the first data write signal and the other said pull-up transistor receives the second data write signal.

10. The sense amplifier arrangement according to claim 9 wherein one said pull-down transistor in the local data write driver circuits for the corresponding latch circuit receives the first data write signal and the other said pull-down transistor receives the second data write signal.

11. A sense amplifier arrangement for an integrated circuit memory comprising:

a latch circuit coupled directly or indirectly to a pair of corresponding bit lines;

first and second pass transistors;

first and second local data write driver circuits each having a first transistor, a second transistor, and an output node coupled selectively by a corresponding one of the first and second pass transistors to the latch circuit and to a corresponding bit line;

said first transistor of said first local data write driver circuit having a control electrode connected to receive a first data write signal;

said second transistor of said first local data write driver circuit having a control electrode connected to receive a second data write signal;

said first transistor of said second local data write driver circuit having a control electrode connected to receive said second data write signal;

said second transistor of said second local data write driver circuit having a control electrode connected to receive said first data write signal.

12. The sense amplifier arrangement according to claim 11 wherein said pass transistors are connected to receive a column write signal.

13. The sense amplifier arrangement according to claim 12 wherein said column write signal is a decoded column write signal.

14. The sense amplifier arrangement according to claim 13 wherein said integrated circuit memory has a plurality of columns and wherein said decoded column write control signal is decoded for a subset of said plurality of columns.

15. The sense amplifier arrangement according to claim 14 wherein said decoded column write signal is decoded for four columns of said memory.

16. The sense amplifier arrangement of claim 11 wherein said first and second data write signals are complementary signals for writing data into an active memory block.

17. The sense amplifier arrangement of claim 16 wherein said first and second data write signals are controlled to have a same value when no write is to occur to a memory cell for the sense amplifier.

18. The sense amplifier arrangement of claim 9 wherein said first and second data write signals are complementary signals for writing data into an active memory block.

19. The sense amplifier arrangement of claim 18 wherein said first and second data write signals are controlled to have a same value when no write is to occur to a memory cell for the sense amplifier.

20. The sense amplifier arrangement of claim 1 wherein each of said local data write driver circuits includes a respective transistor having a control electrode and further electrodes;

wherein one of said control electrodes of at least one of said transistors is connected to receive one of said second write control signals; and wherein said one control electrode is also connected to one of said further electrodes of said transistor.

21. The sense amplifier arrangement of claim 1 wherein each of said local data write driver circuits includes a respective transistor having a control electrode and further electrodes; and wherein, in each said local data write driver circuit, a said transistor is connected to receive a corresponding second write control signal at both its control electrode and one of its said further electrodes.

22. The sense amplifier arrangement of claim 1 wherein each of said local data write driver circuits includes a respective pull-up transistor having a control electrode and two further electrodes;

wherein each of said pull-up transistors in said local data write drivers is connected to receive a respective one of said second write control signals at both its control electrode and one of its further electrodes.

23. The sense amplifier arrangement of claim 22 wherein each of said local data write driver circuits includes a respective pull-down transistor connected in series with said pull-up transistor, and wherein the corresponding pass transistor is coupled to a node between the pull-up transistor and the pull-down transistor.

24. The sense amplifier arrangement of claim 1 wherein each of said local data write driver circuits includes a respective transistor having gate and drain electrodes;

wherein said gate and drain electrodes of one said transistor in one of said local data write driver circuits are connected to receive one second write control signal; and wherein said gate and drain electrodes of another said transistor in the other local data write driver circuit are connected to receive another second write control signal.

25. The sense amplifier arrangement of claim 24 wherein said second write control signal connected to one said local data write driver circuit is the logical complement of said second write control signal connected to the other local data write driver circuit, for an active write.

26. The sense amplifier arrangement of claim 11 wherein each of said first transistors in said local data write driver circuits further includes further electrodes, and wherein one of said further electrodes is coupled to receive a selected one of said first and second data write signals.

27. The sense amplifier arrangement of claim 26 wherein, for each of said local data write driver circuits, said first transistor control electrode is connected to one of said first transistor further electrodes.

28. The sense amplifier arrangement of claim 27 wherein said first transistors comprise pull-up transistors.

29. The sense amplifier arrangement of claim 28 wherein each said first transistor comprises a field effect transistor having one side of a source-drain path connected to a gate electrode, and
wherein said second transistors comprise field effect transistors connected as pull-down transistors.

30. A sense amplifier arrangement for an integrated circuit memory comprising:
a sense amplifier latch circuit having internal nodes coupled directly or selectively to at least one pair of bit lines of the memory;
a local data write driver circuit coupled to said latch circuit, said driver circuit including a plurality of transistors coupled together;
said local data write driver circuit being responsively coupled to a data write control signal so that a power supply voltage may be selectively coupled via said local data write driver circuit to an internal node of said latch circuit and thus to a corresponding bit line, in accordance with said data write control signal.

31. The sense amplifier arrangement according to claim 30 wherein said data write control signal includes first and second data write control signals; and
wherein said local data write driver circuit includes a first transistor responsively coupled to said first data write control signal and coupled to a first power supply voltage, and a second transistor responsively coupled to said second data write control signal and coupled to a second power supply voltage.

32. The sense amplifier arrangement according to claim 30 wherein said data write control signal includes first and second data write control signals; and
wherein said local data write driver circuit comprises first and second local data write driver circuits, each including respective first and second transistors responsively coupled to said first and second data write control signals, each said transistor also being coupled to a corresponding power supply voltage.

33. The sense amplifier arrangement according to claim 32 wherein, for each of said first and second local data write driver circuits, one of said transistors includes a control electrode connected to another electrode of the transistor.

34. The sense amplifier arrangement according to claim 30 wherein said local data write driver circuit comprises a pair of transistors having source-drain paths connected in series between first and second power supply voltages;
at least one of said local data write driver circuit transistors having a gate electrode connected to receive said data write control signal.

35. The sense amplifier arrangement according to claim 34 wherein one of said power supply voltages is provided by said data write control signal.

36. The sense amplifier arrangement according to claim 34 further comprising a coupling transistor coupling said local data write driver circuit to a corresponding one of said internal nodes.

37. The sense amplifier arrangement according to claim 36 wherein said coupling transistor is responsively coupled to a column control signal.

38. The sense amplifier arrangement according to claim 35 further comprising a coupling transistor coupling said local data write driver circuit to a corresponding one of said internal nodes.

39. The sense amplifier arrangement according to claim 38 wherein said coupling transistor is responsively coupled to a column control signal.

\* \* \* \* \*